United States Patent
Disterhof et al.

(10) Patent No.: US 10,619,237 B2
(45) Date of Patent: Apr. 14, 2020

(54) METHOD AND DEVICE FOR PLASMA TREATMENT OF CONTAINERS

(71) Applicant: KHS CORPOPLAST GMBH, Hamburg (DE)

(72) Inventors: Alexander Disterhof, Hamburg (DE); Michael Herbort, Hamburg (DE); Sebastian Kytzia, Todesfelde (DE)

(73) Assignee: KHS CORPOPLAST GMBH, Hamburg (DE)

( * ) Notice: Subject to any disclaimer, the term of this patent is extended or adjusted under 35 U.S.C. 154(b) by 0 days.

(21) Appl. No.: 16/085,894

(22) PCT Filed: Mar. 16, 2017

(86) PCT No.: PCT/EP2017/056223
§ 371 (c)(1),
(2) Date: Sep. 17, 2018

(87) PCT Pub. No.: WO2017/162509
PCT Pub. Date: Sep. 28, 2017

(65) Prior Publication Data
US 2019/0032200 A1    Jan. 31, 2019

(30) Foreign Application Priority Data
Mar. 24, 2016  (DE) .................. 10 2016 105 548

(51) Int. Cl.
*C23C 16/04* (2006.01)
*C23C 16/44* (2006.01)
(Continued)

(52) U.S. Cl.
CPC ........ *C23C 16/045* (2013.01); *C23C 16/4412* (2013.01); *C23C 16/45561* (2013.01);
(Continued)

(58) Field of Classification Search
CPC ............... C23C 16/045; C23C 16/4412; H01J 37/32899
See application file for complete search history.

(56) References Cited

U.S. PATENT DOCUMENTS 4,866,346 A * 9/1989 Gaudreau ......... H01J 37/32192
315/111.21
5,324,361 A   6/1994 Etzkorn et al.
(Continued)

FOREIGN PATENT DOCUMENTS

DE   4233512 A1     4/1994
DE   10225609 A1 * 12/2003 ........... C23C 16/045
(Continued)

OTHER PUBLICATIONS

Intellectual Property India: Government of India—Examination Report Under Sectons 12&13 of the Patents Act, 1970 and the Patents Rules, 2003. For: India Application No. IN 201817037555, IN Examination Report dated Oct. 31, 2019.
(Continued)

*Primary Examiner* — Dah-Wei D. Yuan
*Assistant Examiner* — Nga Leung V Law
(74) *Attorney, Agent, or Firm* — Abelman, Frayne & Schwab

(57) ABSTRACT

A method and a device for plasma treatment of containers by means of a plurality of treatment segments each having at least one plasma station on a plasma module comprising a plasma wheel, wherein, during an operational malfunction and/or a cut-out in at least one of the plasma stations, the process gas, before being supplied to the plasma station in question, is carried off into the respective plasma chamber and/or the container held therein, by means of at least one bypass line.

14 Claims, 6 Drawing Sheets

(51) Int. Cl.
*C23C 16/511* (2006.01)
*C23C 16/52* (2006.01)
*C23C 16/54* (2006.01)
*C23C 16/455* (2006.01)
*H01J 37/32* (2006.01)

(52) U.S. Cl.
CPC ............ *C23C 16/511* (2013.01); *C23C 16/52* (2013.01); *C23C 16/54* (2013.01); *H01J 37/3288* (2013.01); *H01J 37/32449* (2013.01); *H01J 37/32899* (2013.01); *H01J 37/32201* (2013.01); *H01J 2237/3321* (2013.01)

(56) References Cited

U.S. PATENT DOCUMENTS

| | | | |
|---|---|---|---|
| 6,328,805 B1 | 12/2001 | Rius | |
| 6,818,068 B1 | 11/2004 | Guiffant et al. | |
| 7,926,446 B2 | 4/2011 | Behle et al. | |
| 2002/0192369 A1 | 12/2002 | Morimoto | |
| 2006/0169026 A1 | 8/2006 | Kage et al. | |
| 2008/0282975 A1 | 11/2008 | Rius | |
| 2010/0319620 A1 | 12/2010 | Koishi et al. | |
| 2011/0139272 A1* | 6/2011 | Matsumoto | C23C 16/448 137/511 |
| 2013/0041241 A1 | 2/2013 | Felts | |
| 2013/0264303 A1 | 10/2013 | Anderson et al. | |

FOREIGN PATENT DOCUMENTS

| | | |
|---|---|---|
| DE | 10225609 A1 | 12/2003 |
| DE | 102004020185 A1 | 11/2005 |
| EP | 1010773 A1 | 6/2000 |
| WO | 1995/022413 A1 | 8/1995 |
| WO | 1999/017334 A1 | 4/1999 |

OTHER PUBLICATIONS

Japanese Patent Office—Notification of Reasons for Refusal for JP Application No. 2018-549488; Notification dated Oct. 29, 2019.

* cited by examiner

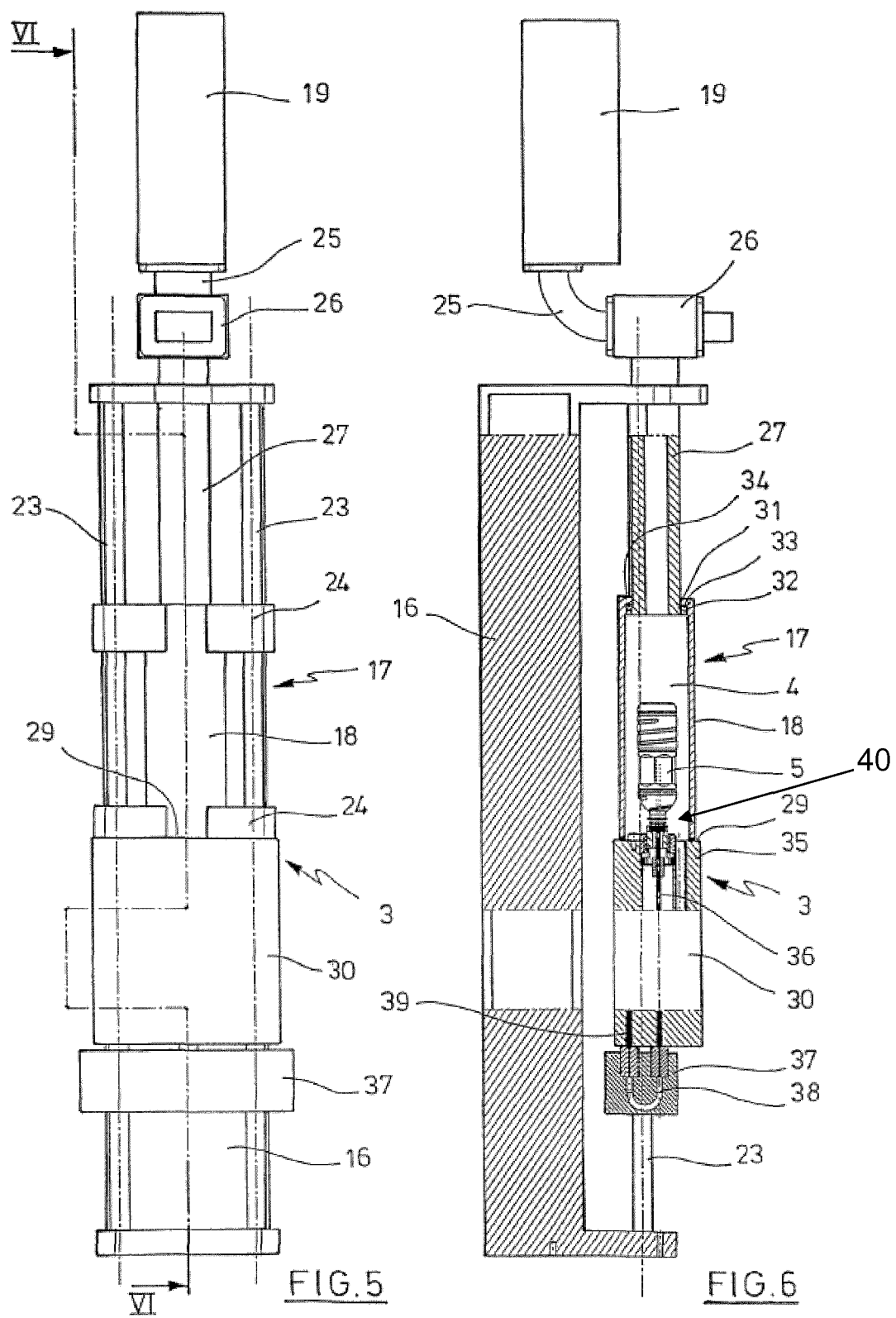

METHOD AND DEVICE FOR PLASMA TREATMENT OF CONTAINERS

CROSS REFERENCE TO RELATED APPLICATION

This application claims priority to International Application No. PCT/EP2017/056223, filed on Mar. 16, 2017, which claims the benefit to German patent application number DE 10 2016 105548.4, filed on Mar. 24, 2016, the content of which are incorporated by reference herein in their entireties.

BACKGROUND OF THE INVENTION

1. Field of the Invention

The invention relates to a method for plasma treatment of containers and to a device for plasma treatment of containers.

2. Description of Related Art

Such methods and devices are, for example, used to provide plastics with surface coatings. In particular, such devices are already known for coating inner or outer surfaces of containers which are provided for the packaging of liquids. Devices for plasma sterilisation are also known.

A plasma chamber for the internal coating of containers made from PET is described in publication WO95/22413 A1. The containers to be coated are lifted by a movable floor into a plasma chamber and connected to an adapter in the region of a container mouth. An evacuating of the container interior can be effected through the adapter. A hollow gas lance is also introduced through the adapter into the interior of the containers in order to supply process gas. The plasma is ignited using a microwave.

The arranging of a plurality of plasma chambers on a rotating wheel is also already known from this publication. A high rate of production of containers per unit of time is assisted in this way.

Publication EP 10 10 773 A1 describes a feeding apparatus in order to evacuate the interior of a bottle and supply it with process gas. WO 01/31680 A1 describes a plasma chamber into which the bottles are introduced by a movable cap which has previously been connected to a mouth region of the bottles.

Publication WO 00/58631 A1 also already shows the arrangement of plasma stations on a rotating wheel and describes, for such an arrangement, a group-by-group allocation of vacuum stages and plasma stations in order to assist a favourable evacuation of the chambers and of the interiors of the bottles. It also mentions the coating of a plurality of containers in a common plasma station or common chamber.

Another arrangement for performing an internal coating of bottles is explained in publication WO 99/17334 A1 which describes in particular an arrangement of a microwave generator above the plasma chamber as well as a vacuum and operating media supply line passing through a floor of the plasma chamber.

DE 10 2004 020 185 A1 describes a gas lance which can be introduced into the interior of a preform which is to be coated, and is used to supply process gases. The gas lance is positionable in the longitudinal position of the container.

With the majority of known devices, plasma-generated container coatings of silicon oxides having the general chemical formula $SiO_x$ are used to improve the barrier properties of the thermoplastic material. Such barrier coatings, especially on the inner wall of a container interior, prevent a penetration of oxygen into the packaged liquids as well as an escape of carbon dioxide in the case of carbonated liquids, and so improve the storage properties and/or the long-lasting shelf life of the liquids that are filled and/or packed in the container.

In a customary device configuration for plasma treatment, n treatment segments are arranged on a plasma wheel in corresponding angular sections, with each treatment segment comprising a plasma station having at least one or a plurality of evacuable plasma chambers which in turn have one or a plurality of treatment places for container treatment. Two or four treatment places for example are arranged in each plasma chamber or in the chamber interior so that consequently n times 2 or n times 4 treatment places in all circulate on a plasma wheel for the aforesaid device types.

With the plasma chamber of a treatment segment being open, the one container or the plurality of containers is/are guided in or guided out together in a loading or unloading step, it being possible for this to be effected either simultaneously or slightly staggered for the individual containers. A plasma station is usually provided as a unit in a treatment segment so that in a loading or unloading step all containers are guided into or out of the plasma station together analogously. In its simplest configuration therefore, a treatment segment incorporates a plasma station having a plasma chamber which comprises a chamber interior in which a treatment place for a container is arranged.

In case of the known methods and devices for plasma treatment, it is customary for the process gas that is introduced into the plasma chamber of a corresponding plasma station to be supplied from a central process gas supply unit which interacts with all plasma stations—or their treatment places—that are arranged on a wheel of the plasma module.

In the event of an operational malfunction, i.e. in particular a breakdown, occurring at one or a plurality of plasma stations or treatment places of the plasma module therefore, in the prior art the process gas supplied for this corresponding plasma station is distributed among the remaining intact plasma stations of the plasma module. This in turn leads to an unwanted increased throughput of process gas at the remaining plasma stations which are intact and hence not subject to any operational malfunction, and therefore ultimately to a negative influence on the quality of the barrier coatings on the inner wall of the containers.

SUMMARY OF THE INVENTION

It is the object of the invention to provide a method and a device for the plasma treatment of containers which even in the event of an operational malfunction, i.e. in particular a breakdown, occurring at at least one plasma station, provides a consistent quality of the barrier coating on the inner wall of the containers at the remaining intact plasma stations. A method for the plasma treatment of workpieces according to claim 1 is configured to resolve this object. A device for the plasma treatment of containers forms the subject-matter of claim 11.

The essential aspect of the inventive method consists in the fact that in case of an operational malfunction or cut-out, i.e. selective deactivation of at least one treatment place and/or plasma station, the process gas is carried off by means of a bypass line before being supplied to the treatment place and/or into the plasma station. The inventive method is carried out at a plasma module comprising a plurality of treatment segments on a plasma wheel and having one or a plurality of plasma stations, and in which the at least partial applying of a process gas to the container interior or container interiors takes place inside the at least partially evacuated plasma chamber, in particular at at least two plasma stations simultaneously. Each plasma station comprises at least one treatment place for one container each. In a particularly advantageous way therefore, the process gas which cannot be used at a faulty treatment place or at a faulty plasma station is now no longer, as is customary in the prior art, distributed to another fully functional plasma station arranged on the plasma wheel. According to the invention, the process gas is instead carried off or taken away by one or a plurality of bypass lines before it is supplied to the treatment place and/or plasma station which is cut out or which has an operational malfunction. An increased throughput of process gas at the treatment places and plasma stations which are operating intact and normally integrated into the coating process is consequently prevented because the quantity of process gas which is predetermined for the faulty plasma station is not distributed among the remaining plasma stations or treatment places but is instead carried off.

A permanent cut-out of a plasma station or of at least one of its treatment places is effected for example when the plasma station has a fault or malfunction. In this way the container reject rate can be reduced pending the repair or replacement of the plasma station. For the sake of simplicity the following sections often refer only to plasma stations, cut-out and operational malfunction even if only individual treatment places of a plasma station are affected, if the cut-out and operational malfunction are only partial for example. In this case according to the invention only one treatment place or individual treatment places of a plasma station or of a plasma chamber are deactivated or the device is designed for and suitable for this. This is always to be understood analogously for the inventive method and the device with all subsequent versions and embodiments.

A temporary cut-out of one of a plurality of plasma stations also takes place when vacuum-technical startup difficulties occur. If the vacuum quality is inadequate it may be necessary to eject the first bottles from the plasma stations if plant speeds are high. A greater vacuum can be generated by the selective automatic cut-out of the upstream plasma stations upon start-up. The ejecting of containers is avoided or at least mitigated because this achieves an adequate vacuum quality for the very first containers that are to be coated, such that the reject rate is reduced.

The bypass is also activated in case of incorrect loading, these are situations in which there is no container in a plasma station or the latter is not correctly held in its mounting. Finally, cut-outs and the activating of bypass flows are also deliberately deployed so as to systematically search for faults. This option improves repair and service friendliness. Hereinafter the term 'operational malfunction' should also always be taken to refer to an instance of a cut-out plasma station, because a full loading and use of all plasma stations of a plasma wheel must be regarded as the norm, so that even a controlled cut-out represents a certain operational malfunction.

The invention naturally also relates to those cases in which one or a plurality of plasma chambers are deactivated, i.e. all plasma stations whose plasma chambers are cut out or have an operational malfunction.

In an advantageous embodiment, at the at least one plasma station which has an operational malfunction, a quantity of process gas can be carried off which corresponds to the quantity of process gas predetermined for this plasma station when operating intact.

In another advantageous embodiment the process gas can be carried off in a regulated and/or controlled manner in the bypass line by means of at least one valve mechanism and/or a throttle device.

In yet another advantageous embodiment the volumetric flow-rate of the process gas that is carried off can be regulated and/or controlled in the bypass line by means of the throttle device.

In another advantageous embodiment the throttle device of the bypass line of the at least one plasma station which has an operational malfunction can be controlled and/or regulated so that the volumetric flow-rate of process gas carried off through the bypass line corresponds to the volumetric flow-rate of process gas which is applied to the at least one plasma station which has an operational malfunction through one or a plurality of a first to third valve mechanisms.

It is an advantage if, at the time of opening of one or a plurality of the first to third valve mechanisms of the at least one plasma chamber which has an operational malfunction, the valve mechanism can be opened simultaneously or a short time before, and the process gas carried off through the bypass line.

Again preferably, the process gas can be supplied in a predetermined quantity of process gas and/or in a timed sequence to the at least one plasma station which has an operational malfunction through one or a plurality of process gas lines of a central process gas supply unit.

In a further advantageous embodiment, the process gas of the at least one plasma station which has an operational malfunction can be carried off by means of the bypass line to a central vacuum device, and preferably into a vacuum line having the lowest vacuum level of the central vacuum device.

For the purpose of this invention, the term 'operational malfunction' is understood to be the decommissioning, i.e. for example the technical failure, in particular of a plasma station, with the result that no plasma treatment of containers can take place at that plasma station with an operational malfunction.

For the purpose of the invention, 'containers' are in particular cans, bottles, barrels including kegs, tubes, pouches, made from metal, glass and/or plastic, as well as other packaging media, in particular including such as are suitable for filling products that are in powder form, granulate-like, liquid or viscous.

For the purpose of the invention the expressions 'essentially', 'about' or 'approx.' mean variations from the respective exact value by +/−10%, preferably by +/−5% and/or variations in the form of changes insignificant for the function.

Further embodiments, advantages and possible applications of the invention arise out of the following description of embodiments and out of the figures. All of the described and/or pictorially represented attributes whether alone or in any desired combination are fundamentally the subject matter of the invention independently of their synopsis in the claims or a retroactive application thereof. The content of the claims is also made an integral part of the description.

BRIEF DESCRIPTION OF THE DRAWINGS

The invention is explained in detail below through the use of embodiment examples with reference to the figures. In the figures:

FIG. 5 shows a front view of the device of FIG. 4 with closed plasma chamber, FIG. 6 shows a cross-section on section line VI-VI in FIG. 5.

DETAILED DESCRIPTION OF THE INVENTION

Figure 1:
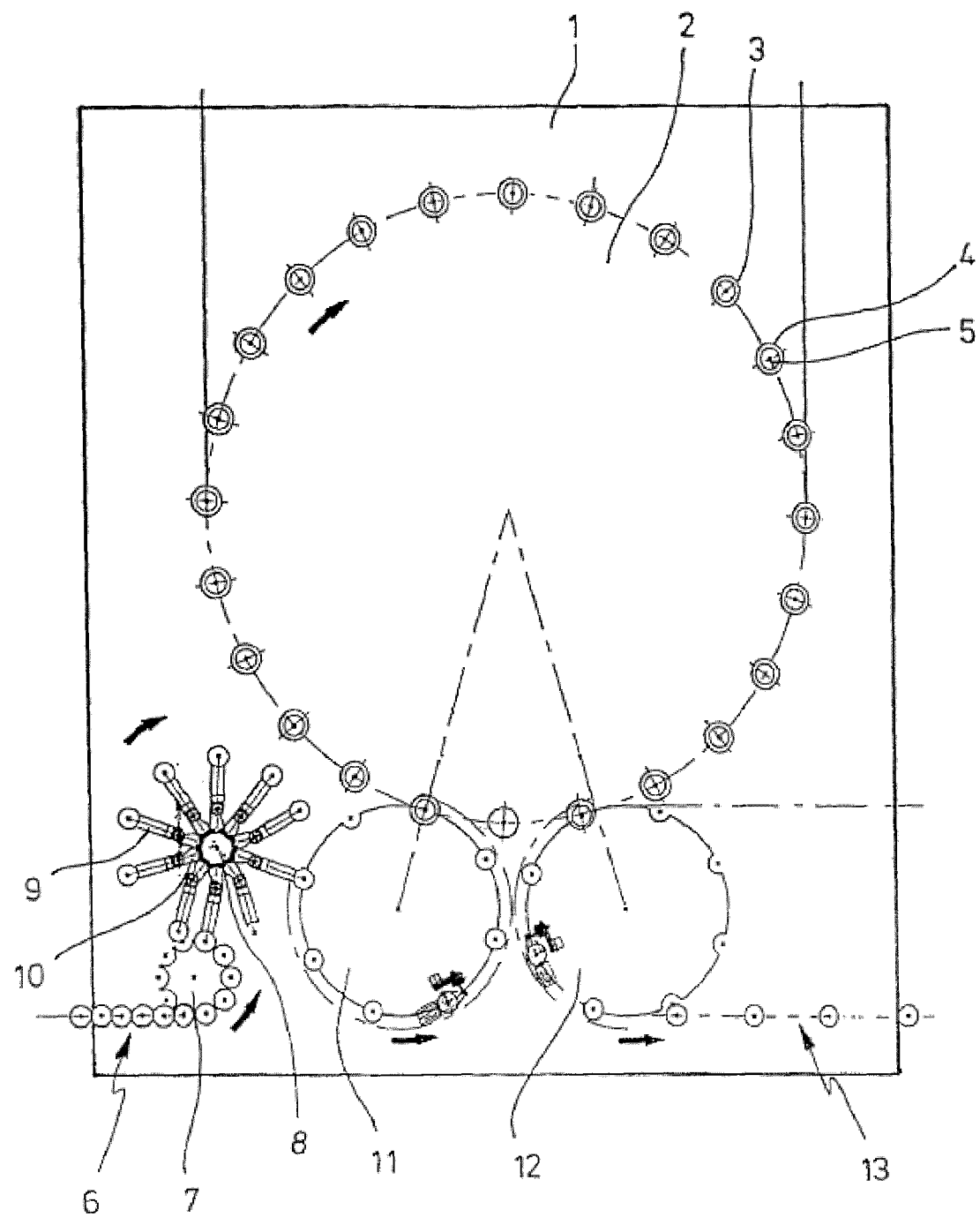
FIG. 1 shows a schematic diagram of a plurality of plasma chambers arranged on a rotating plasma wheel which is coupled to entry and exit wheels.

In FIG. 1, reference character 1 refers generally to a plasma module provided with a rotating plasma wheel 2. A plurality of identically configured plasma stations 3 is provided arranged along a circumference of plasma wheel 2. The plasma stations 3 are provided with chamber interiors 4 or plasma chambers 17 to accept the containers 5 to be treated, each container having at least one container interior 5.1.

The containers 5 to be treated are fed to the plasma module 1 in the region of an entry 6 and then conveyed by a descrambling wheel 7 to a transfer wheel 8 which is equipped with positionable support arms 9. The support arms 9 are arranged so they can be swiveled relative to a base 10 of the transfer wheel 8 in order that the distances of the containers 5 relative to one another can be changed. As a result, a transfer of the containers 5 from the transfer wheel 8 to an entry wheel 11 is effected with a distance between the containers 5 that is increased relative to descrambling wheel 7. The entry wheel 11 transfers the containers 5 to be treated to the plasma wheel 2. After the treatment has been carried out, the treated containers 5 are removed by an exit wheel 12 out of the region of the plasma wheel 2 and transferred to the region of an exit section 13.

Figure 2:
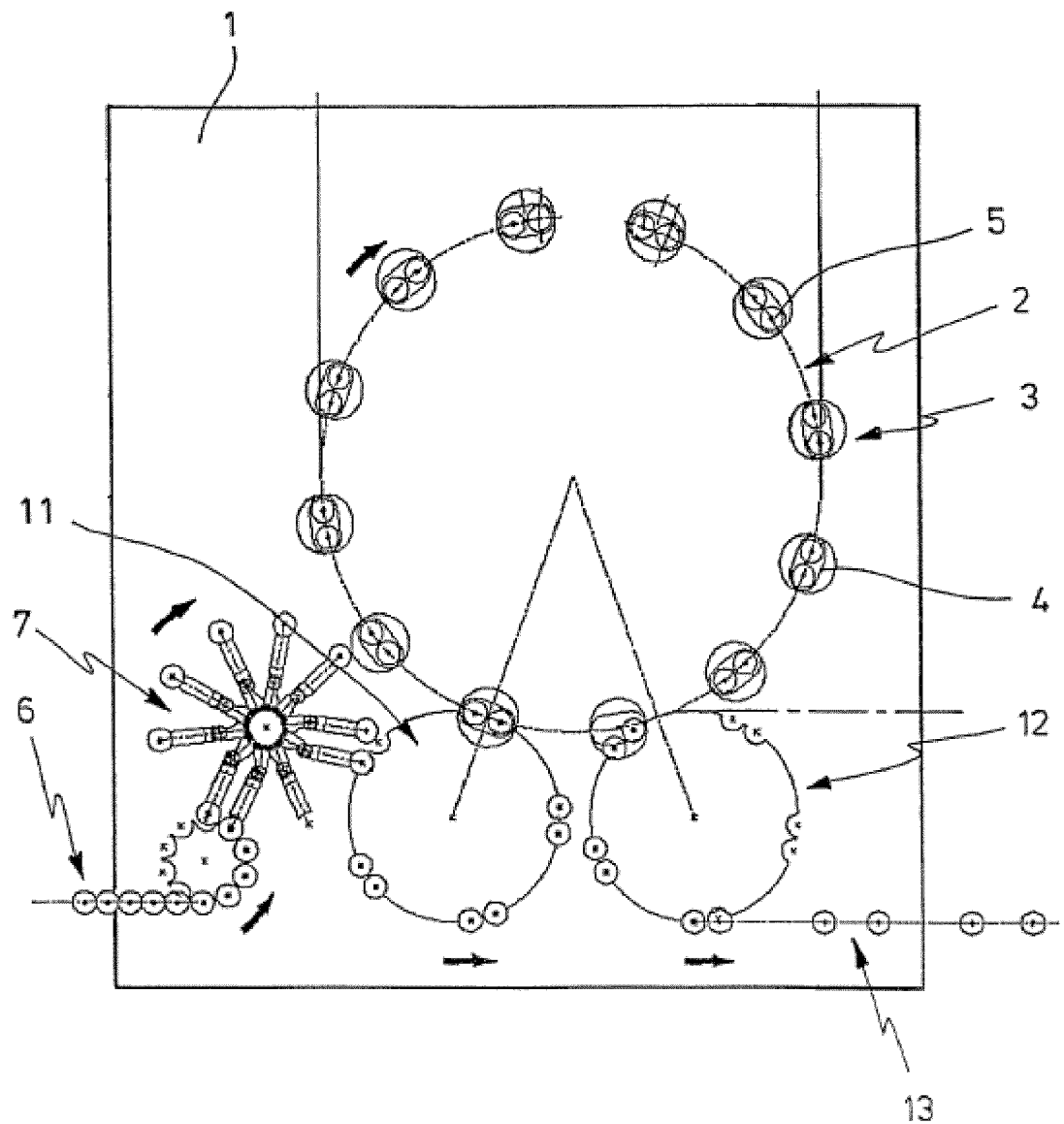
FIG. 2 shows an arrangement according to FIG. 1 in which the plasma stations each comprise two plasma chambers.

With the embodiment according to FIG. 2, the plasma stations 3 are each equipped with two treatment places (40) and associated chamber interiors 4 or plasma chambers 17. Two containers 5 can be treated together simultaneously as a result. It is essentially possible to configure the chamber interiors 4 completely separate from one another, but it is essentially also possible for only sections of a common chamber interior to be separated in such a way that an optimum coating of all the containers 5 is guaranteed. In particular it is proposed to separate the partial chamber interiors from one another by separate microwave injections.

Figure 3:
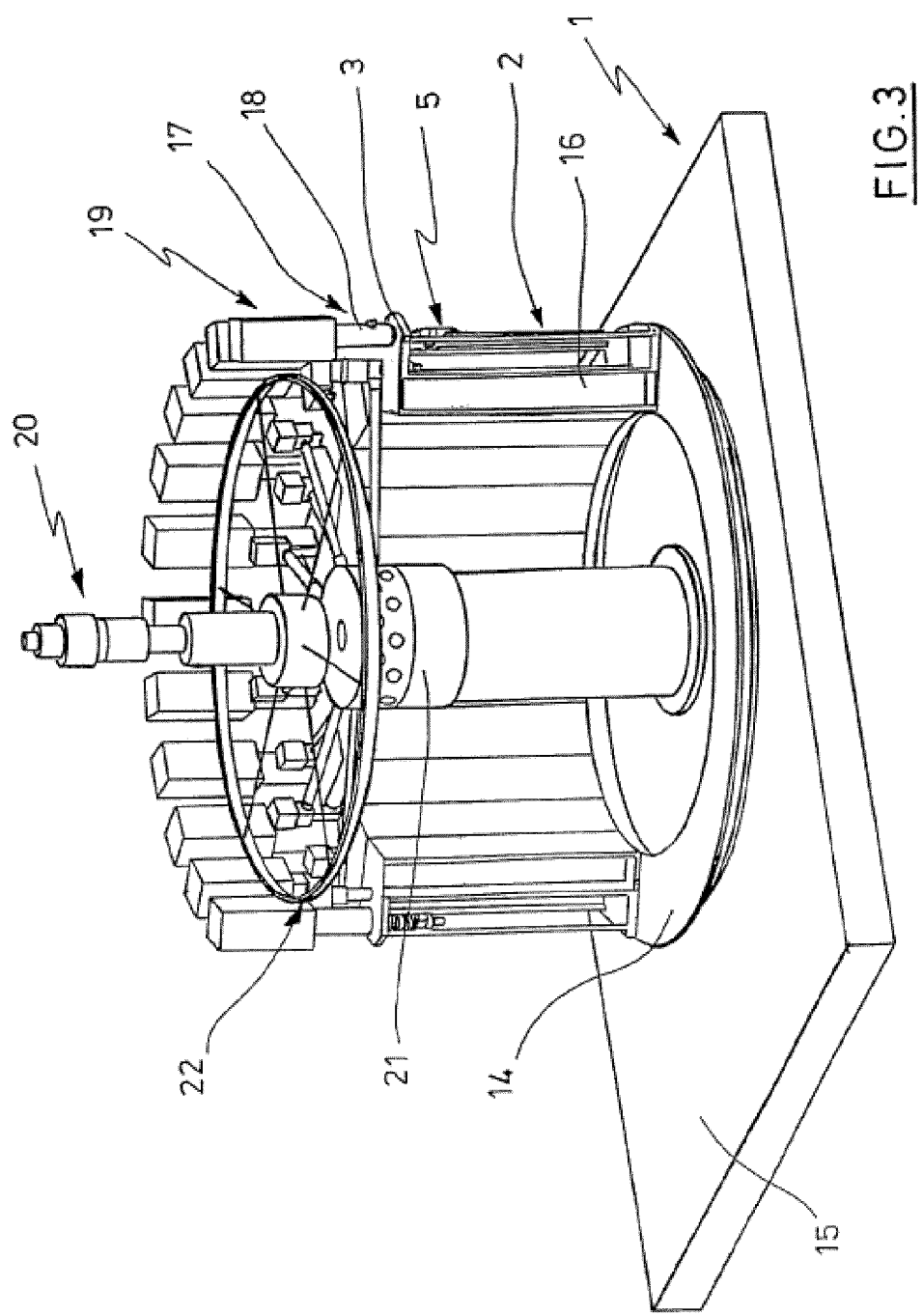
FIG. 3 shows a perspective view of a plasma wheel having a plurality of plasma chambers.

FIG. 3 shows a perspective view of a plasma module 1 with a partially constructed plasma wheel 2. The plasma stations 3 are arranged on a carrier ring 14 which is configured as part of a rotary connection and mounted in a region of the machine base 15. The plasma stations 3 each comprise a station frame 16 which holds the plasma chambers 17.

The plasma chambers 17 can comprise cylindrical chamber walls 18 as well as microwave generators 19.

A rotary distributor 20 by which the plasma stations 3 are supplied with operating media such as, for example, process gas and energy can be provided in a centre of the plasma wheel 2. The rotary distributor 20 can in particular interact with a central process gas supply unit. The ring mains 21 can in particular be fitted or positioned for operating media distribution on the plasma wheel 2.

The containers 5 to be treated are shown beneath the cylindrical chamber walls 18, with lower parts of the plasma chambers 17 not being shown for the sake of simplicity.

Figure 4:
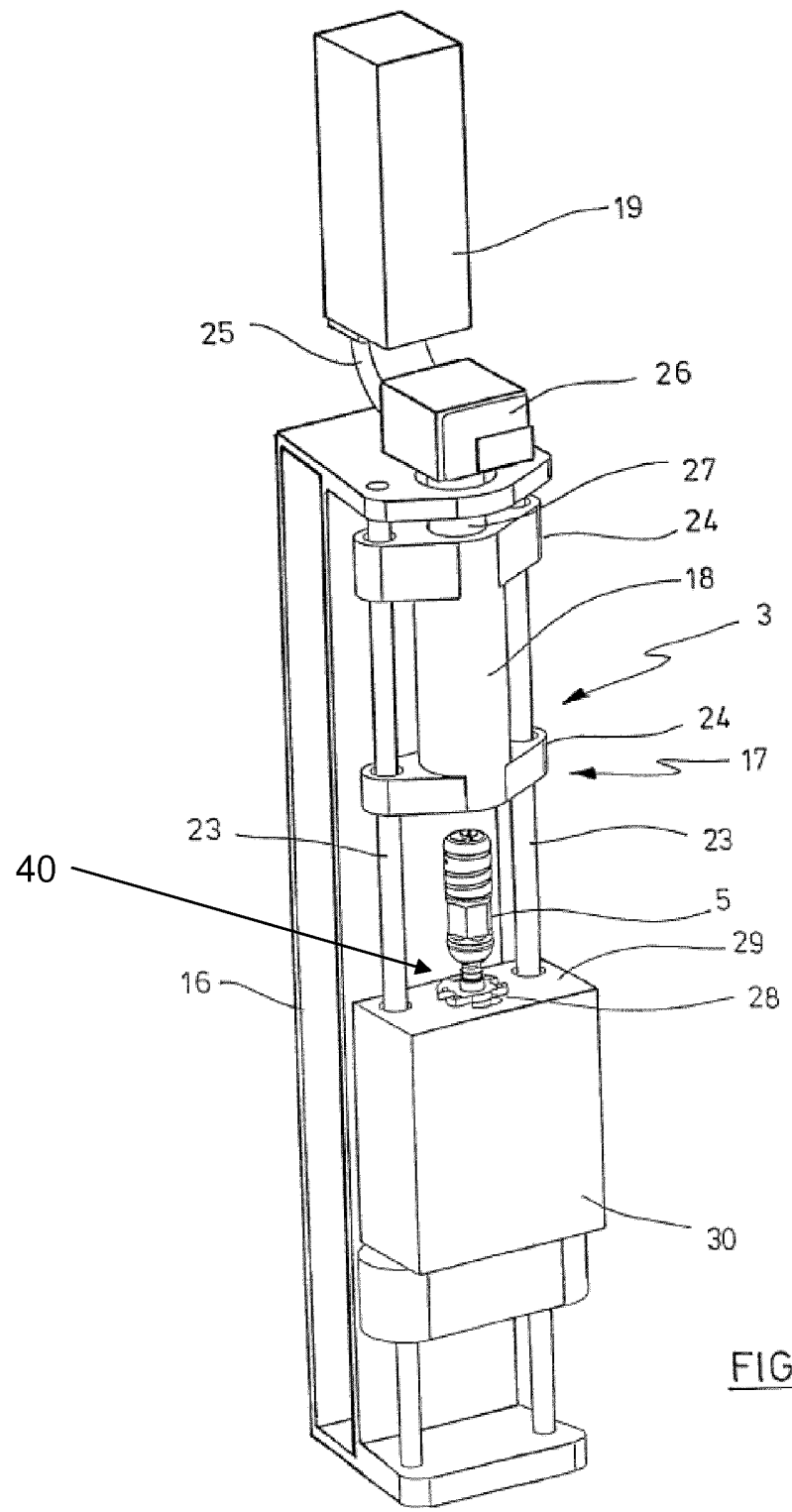
FIG. 4 shows a perspective view of a plasma station which has one plasma chamber.

FIG. 4 shows a perspective view of a plasma station 3 which has a treatment place 40 for a container 5. It can be seen that the station frame is provided with guide rods 23 on which a carriage 24 for holding the cylindrical chamber wall 18 is guided. FIG. 4 shows the carriage 24 with the chamber wall 18 in a raised state such that the container 5 is released.

The microwave generator 19 is arranged in the upper region of the plasma station 3.

The microwave generator 19 is connected by means of a deflector 25 and an adapter 26 to a coupling channel 27 which opens out into the plasma chamber 17. The microwave generator 19 can essentially be arranged either in the immediate vicinity of the chamber cover 31 or coupled by means of a spacer element to the chamber cover 31 at a pre-definable distance away from the chamber cover 31 and thus in a greater surrounding region of the chamber cover 31. The adapter 26 has the function of a transition element and the coupling channel 27 is configured as a coaxial conductor. A quartz glass window is arranged in the region of a mouth of the coupling channel 27 opening into the chamber cover 31. The deflector 25 is configured as a waveguide.

The container 5 is positioned at treatment place 40 by a holding element 28 arranged in the region of a chamber floor 29. The chamber floor 29 is configured as part of a chamber base 30. The chamber base 30 can be fixed in the region of the guide rods 23 in order to make adjustment easier. Another variant consists in attaching the chamber base 30 directly to the station frame 16. In case of such an arrangement it is also possible, for example, for the guide rods 23 to be executed in two parts in the vertical direction.

FIG. 5 shows a front view of the plasma station 3 according to FIG. 3 and FIG. 4, with the plasma chamber 17 in a closed state. Here, the carriage 24 with the cylindrical chamber wall 18 is lowered relative to the positioning in Figure so that the chamber wall 18 is driven against the chamber floor 29. The plasma coating can be performed in this positioning state.

FIG. 6 shows the arrangement of FIG. 5 in a vertical sectional view. In particular it can be seen that the coupling channel 27 opens out into a chamber cover 31 which comprises a laterally proud flange 32. A seal 33 which is put under pressure by an inner flange 34 of the chamber wall 18 is arranged in the region of the flange 32. This brings about a sealing off of the chamber wall 18 relative to the chamber cover 31 when the chamber wall 18 is in a lowered state. A further seal 35 is arranged in a lower region of the chamber wall 18 so as to guarantee a sealing off relative to the chamber floor 29 here too.

In the positioning shown in FIG. 6, the chamber wall 18 encloses the chamber interior 4 so that both the chamber interior 4 and a container interior 5.1 of the container 5 can be evacuated. In order to assist a supplying of process gas, a hollow gas lance 36 which can be moved into the container interior 5.1 of the container 5 is arranged in the region of the chamber base 30. To facilitate a positioning of the gas lance 36 the latter is mounted on a lance carriage 37 which can be positioned along the guide rods 23. Inside the lance carriage 37 runs a process gas channel 38 which when in the raised position shown in FIG. 6 is coupled with a gas connection 39 of the chamber base 30. Tube-like connecting elements on the lance carriage 37 are avoided by this arrangement. When the gas lance 36 is in a state in which it is advanced into the container interior then the container interior 5.1 of the container 5 is isolated, i.e. sealed off, from the chamber interior 4, whereas when the gas lance 36 is in a lowered state, a gas-permeable connection is created between the container interior 5.1 of the container 5 and the chamber interior 4.

Figure 7:
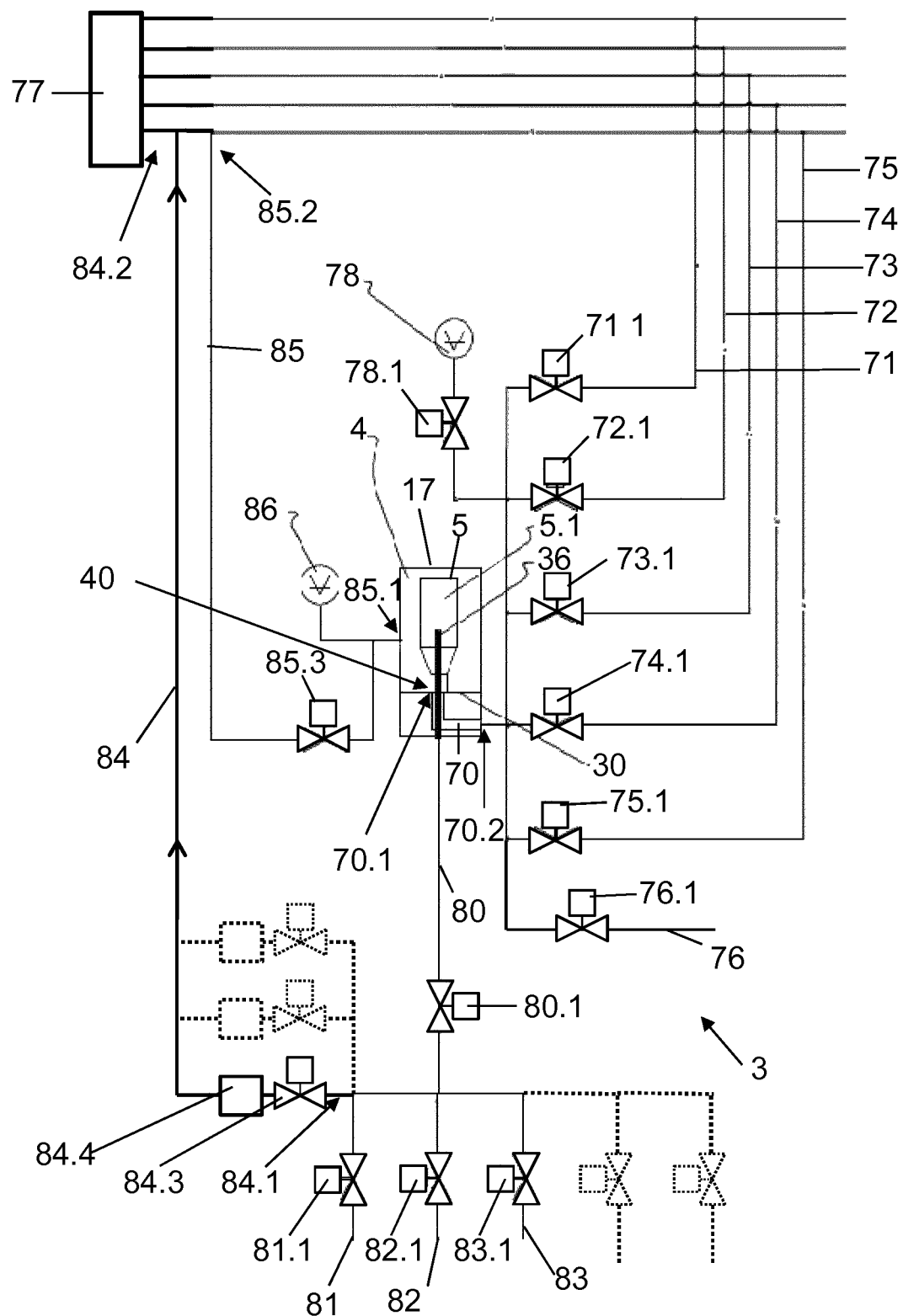
FIG. 7 shows a schematic block diagram of a plasma station configured according to the invention.

FIG. 7 shows by way of example a schematic block diagram depicting a treatment place 40 of a plasma station 3 as can be arranged singly or in multiple number in a plasma chamber 17 according to any one of the foregoing embodiments. In the plasma chamber 17, the container 5 is placed and positioned in the chamber interior 4 in a gas-tight and/or air-tight manner. In this instance the chamber base 30 comprises a vacuum channel 70. The vacuum channel 70 opens out with its first side 70.1 into the plasma chamber 17 or, depending on the position of the gas lance 36, also creates a gas-permeable connection into the container interior 5.1 of the container 5. In particular, provision can be made so that with the gas lance 36 in a state in which it is inserted into the container interior 5.1, the container interior is isolated, i.e. sealed off, from the chamber interior 4, whereas when the gas lance 36 is in a lowered state a gas-permeable connection is created between the container interior 5.1 of the container 5 and the chamber interior 4.

At least one first to fifth vacuum line 71 . . . 75 and at least one venting line 76 can also be connected on a second side 70.2 of the vacuum channel 70, the venting line 76 being in particular configured so as to be activated and/or deactivated by a valve mechanism 76.1 that can be regulated and/or controlled. In addition, each of the first to fifth vacuum lines 71 . . . 75 can also comprise at least one valve mechanism 71.1 . . . 75.5 that can be regulated and/or controlled, said valve mechanisms 71.1 . . . 76.1 being triggerably configured by a machine controller (not shown) of the plasma module 1.

On the end facing away from second side 70.2 of vacuum channel 70, first to fifth vacuum lines 71 . . . 75 are in fluid-tight connection preferably with a vacuum device 77 common to all vacuum lines 71 . . . 75. Vacuum device 77 is designed in particular to generate the vacuum which is necessary in the plasma chamber and container interior 5.1 during the plasma treatment. Vacuum device 77 is also designed to generate different vacuums at first to fifth vacuum line 71 . . . 75, i.e. different vacuum levels for each vacuum line 71 . . . 75. Fifth vacuum line 75 preferably comprises a greater vacuum, i.e. a lower vacuum level, than first vacuum line 71. In particular, it is proposed that the vacuum levels of each vacuum line 71 . . . 75 are lowered further in such a way that the lowest vacuum is present in fifth vacuum line 75. Alternatively it is also possible to connect each of individual vacuum lines 71 . . . 75 to separate vacuum devices 77.

In particular, provision can be made for the plasma chamber 17 and/or the container interior 5.1 to be lowered to different vacuum levels by means of first to fifth vacuum line 71 . . . 75. This can be achieved for example in that the plasma chamber 17 including the container interior 5.1 is lowered to a first vacuum level by the first vacuum line 71 with opened valve mechanism 71.1, while for example when valve mechanism 72.1 of second vacuum line 72 is opened a vacuum level is created in both the plasma chamber 17 and in the container interior 5.1 which is lower than the first vacuum level. Provision may also be made for example for fifth vacuum line 75 to be configured as a process vacuum line which is opened in order to maintain the vacuum synchronously with the supplying of a process gas during the plasma treatment. In this way the provided process vacuum line avoids a transfer of extracted process gas into the supply circuits of the other vacuum lines, for example of first to fourth vacuum line 71 . . . 74.

A pressure measuring device 78 which is configured for example as pressure measuring tubes and designed to measure the vacuum generated by the first to fifth vacuum line 71 . . . 75 can also be associated with the first to fifth vacuum line 71 . . . 75. In particular, the pressure measuring device 78 can be associated with an upstream valve mechanism 78.1, and can be arranged in a fluid connection of the second vacuum line 72 to the second side 70.2 of the vacuum channel 70.

In addition, the gas lance 36 can be connected by a, for example, central process gas line 80 to for example a first to third process gas line 81 . . . 83 through each of which different process gas compositions can be supplied in particular to the container interior 5.1 by means of the gas lance 36. Each of first to third process gas lines 81 . . . 83 can also comprise at least one valve mechanism 81.1 . . . 83.1 which can be regulated and/or controlled for example by the central machine controller of the plasma module 1. Consequently, the central process gas line 80 can also comprise such a valve mechanism 80.1 which can be regulated and/or controlled.

In addition to this, between the valve mechanism 80.1 of the central process gas line 80 and the valve mechanisms 81.1 . . . 83.1 of first to third process gas line 81 . . . 83, at least one bypass line 84 is preferably branched off with its first side 84.1 in a fluid-tight manner and opens out into one of first to fifth vacuum lines 71 . . . 75 with its second side 84.2 likewise in a fluid-tight manner. The bypass line 84 is configured so that in case of an operational malfunction of the plasma station 3 or of treatment place 40, the process gas flowing in through first to third process gas line 81 . . . 83 is carried off before being supplied into the plasma chamber 17 of this at least one treatment place 40 comprising an operational malfunction, and advantageously into one of first to fifth vacuum lines 71 . . . 75. In an especially advantageous way, the bypass line 84 opens out with its second side 84.2 in a fluid-tight manner into the vacuum line of the central vacuum device 77 with the lowest vacuum level, i.e. into the fifth vacuum line 75 according to the embodiment shown in FIG. 7. In an alternative embodiment the bypass line 84 can also open out in a fluid-tight manner into a separate vacuum device (not shown).

The bypass line 84 also comprises at least the valve mechanism 84.3 which can be controlled and/or regulated by the central machine controller of the plasma module 1, and at least one throttle device 84.4 which can be controlled and/or regulated to throttle the rate of flow or limit the volumetric flow-rate of process gas flowing through the bypass line 84. For example, the throttle device 84.4 can be configured as a controllable and/or variable gate valve and therefore in particular to limit the volumetric flow-rate of process gas flowing through the bypass line 84. In particular, the throttle device 84.4 of the valve device 84.3 is provided downstream in the bypass line 84 in the direction of flow indicated by the arrows.

The internal cross-section of the bypass line 84 can be particularly advantageously dimensioned and/or set by means of throttle device 84.4 so that the volumetric flow-rate of process gas carried off through bypass line 84 is approximately equal to the volumetric flow-rate of process gas supplied through the central process gas line corresponding treatment place 40 during the application of process gas. In other words therefore, the inner cross-section of bypass line 84 is selected or set by means of throttle device 84.4 so that while the process gas is being carried off, approximately the same vacuum guide value is present in bypass line 84 as in central process gas line 80 during the application of process gas for the plasma treatment.

Additionally, a sixth vacuum line 85 can also be connected with, or open out into, the plasma chamber 17 directly and in particular in a fluid-tight manner by a first side 85.1, and by a second side 85.2 can interact by means of the fifth vacuum line 75 in a fluid-tight manner with the central vacuum device 77 through the intermediary of a variable and/or controllable valve mechanism 85.3. The sixth vacuum line 85 can also be associated with a pressure measuring device 86 configured for example as a pressure measuring tube for measuring in particular the vacuum inside the plasma chamber 17.

A typical treatment operation at an exemplary treatment place 40 with no operational malfunction is explained below using the example of a coating operation in which the method for the plasma treatment of containers 5 is carried out at a plasma module 1 comprising a plurality of plasma station 3 with respective treatment places 40 on a plasma wheel 2.

Here, respective container 5 is first transported to plasma wheel 2 with the use of the entry wheel and, with sleeve-like chamber wall 18 in a raised state, the container 5 is inserted into corresponding treatment places 40. On completion of the insertion process, respective chamber wall 18 at this treatment place 40 is lowered down into its sealed-off position and a simultaneous evacuation of both chamber interior 4 and of the container interior 5.1 of the container 5 is initially carried out.

Following an adequate evacuation of the chamber interior 4, the corresponding gas lance 36 is introduced into the container interior 5.1 of the container 5 and a sealing-off of the container interior 5.1 from the chamber interior 4 is effected by a displacing of sealing element 28. It is also possible that the gas lance 36 is already introduced into the container 5 synchronously with the start of the evacuation of the chamber interior 4. The pressure in the container interior 5.1 can subsequently be reduced even further. It is moreover also possible for the positioning movement of the gas lance 36 to be carried out at least partially in parallel with the positioning of the chamber wall 18.

When a sufficiently low vacuum is reached, process gas is introduced into the container interior 5.1 of the container 5 at the corresponding treatment place 40 and the plasma is ignited with the aid of the microwave generator 19. Measures can in particular be provided such that with the aid of the plasma, both a bonding agent as well as the actual barrier and protective coating of silicon oxides are precipitated onto an inner surface of the container 5.

On completion of the coating operation, i.e. the plasma treatment, the gas lance 36 is removed from the container interior 5.1, i.e. is lowered, and synchronously with or prior to the lowering of the gas lance 36, at least the container interior 5.1 of the container 5—and if required the plasma chamber 17 also—is at least partially vented.

If at least one of treatment places 40 is subject to an operational malfunction then at the time when the process gas is introduced or supplied at or into the corresponding plasma chamber 17 the process gas of this at least one treatment place 40 which is subject to an operational malfunction is carried off by means of the bypass line 84. The result is that at the least one further treatment place 40 of the plasma module 1 where there is no operational malfunction and which at that time is also undergoing the same process step of being applied with process gas, no increased throughput of process gas is supplied by the central process gas supply unit. This is because the proportion or quantity of process gas that is predetermined for treatment place 40 subject to an operational malfunction is carried off by the bypass line 84. There is therefore no negative effect on the quality of the plasma coating at this at least one further operational treatment place 40 because treated containers 5 are applied with the predetermined quantity of process gas. Because the at least one treatment place 40 subject to an operational malfunction the inflowing process gas is carried off by means of the bypass line 84, the coating process can be carried out and/or continued with a consistently high coating quality at the remaining the plasma stations 3 or their treatment places 40 provided on the plasma module 1.

Initially, after a closing of the plasma chamber 17, first and sixth valve mechanism 71.1 and 85.1 respectively, for example, are opened at at least one plasma chamber 3 which is operating intact, i.e. not subject to any operational malfunction, and both the container interior 5.1 as well as the interior of the plasma chamber 17 are evacuated via first and sixth vacuum line 71 and 85 respectively. The valve mechanism 80.1 of the central process gas line 80 is preferably closed while this is taking place. In particular, the valve mechanism 76.1 of the venting line 76 is also closed during the evacuation of the container interior 5.1 and of the plasma chamber 17. After a closing of the first valve mechanism 71.1, the second valve mechanism 72.1 for example can be opened allowing the container interior 5.1 to be taken down to a lower pressure level by the second vacuum line 72. The container interior 5.1 and/or the plasma chamber 17 can also be taken down to progressively lower vacuum levels by third or fourth vacuum line 73, 74 if this is necessary for the coating process. Once a sufficiently low pressure level is reached in the container interior 5.1 and/or the plasma chamber 17, the corresponding valve mechanisms 71.1 . . . 75.1 can be closed. Alternatively provision may also be made for fifth valve mechanism 75.1 and sixth valve mechanism 85.3 in particular to stay open so as to provide a sustained sufficiently low pressure level in the container interior 5.1 and the plasma chamber 17 during the subsequent treatment steps.

Here, one or a plurality of first to third valve mechanisms 81.1 . . . 83.1 of the first to third process gas lines 81 . . . 83, as well as the valve mechanism 80.1 of the central process gas line 80, can be opened at the at least one correctly operating plasma chamber 3 simultaneously with or prior to a positioning of the gas lance 36 inside the container interior 5.1, and a process gas of a predetermined composition and of a predetermined gas quantity can be supplied in particular to the container interior 5.1 through the gas lance 36.

Furthermore, at the at least one plasma chamber 3 which has an operational malfunction, one or a plurality of first to third valve mechanisms 81.1 . . . 83.1 of the first to third process gas lines 81 . . . 83 are also opened in the predetermined timed sequence relative to remaining the plasma chambers 3 provided at the plasma module 1, whereas the valve mechanism 80.1 of the central process gas line 80 of this one treatment place 3 comprising an operational malfunction is closed, as a result of which an inflow of the process gas into the corresponding plasma chamber 17 is not possible. Thus the at least one treatment place 40 which has an operational malfunction is supplied with a quantity of process gas which corresponds with the quantity of process gas predetermined for this treatment place 40 when operating intact.

It is particularly preferable if, at the time of the opening of one or a plurality of a first to third valve mechanisms 81.1 . . . 83.1 of first to third process gas lines 81 . . . 83 of the at least one plasma station 3 which has an operational malfunction, the valve mechanism 84.3 is opened simultaneously or a short time before and the process gas carried off through the bypass line 84.

In particular, at the at least one plasma station 3 which has an operational malfunction, at the time of the opening of the valve mechanism 84.3 of the bypass line 84, the valve mechanism 80.4 of the central process gas line 80 is closed such that the process gas supplied by the central process gas supply unit is fed by the bypass line 84 to the central vacuum device 77. The process gas is in particular ejected via the fifth vacuum line 75. The process gas can in particular be supplied via the rotary distributor 20 provided in the centre of the plasma wheel 2 to the plasma stations 3 or to the respective treatment place 40, while the actual process gas distribution can be effected via the ring lines 21.

Following an adequate supply of process gas, the microwave generator 19 ignites the plasma in the container interior 5.1 of the container 5. In this context provision can be made so that, for example, the valve mechanism 81.1 of the first process gas line 81 closes at a pre-definable time, while the valve mechanism 82.1 of the second process gas line 82 is opened to supply a process gas of a second composition. At the same time the fifth valve mechanism 75.1 and/or the sixth valve mechanism 85.3 can also be opened at least temporarily in order to maintain a sufficiently low vacuum in particular in the container interior 5.1 and/or the process chamber 17. A pressure level of approx. 0.3 mbar proves to be appropriate here.

On completion of the plasma treatment, valve mechanisms 81.1 . . . 83.1 of the first to third process gas line 81 . . . 83 and all the valve mechanisms 71.1 . . . 75.1, 85.3 of the first to sixth vacuum line 71 . . . 75, 85 which are still open at this time are closed, while the valve mechanism 76.1 of the venting line 76 is opened and at least container interior 5.1 of the container 5 is at least partially vented after the plasma treatment at the at least one treatment place 40 of the plasma station 3. The container interior 5.1 of the container 5 is preferably vented up to atmospheric pressure.

The venting is preferably effected by the gas lance 36 in the container interior 5.1. The gas lance 36 can be lowered down out of the container interior 5.1 at the same time. Once the container interior 5.1 and the plasma chamber 17 have been adequately vented, preferably up to atmospheric or ambient pressure, the open valve mechanism 76.1 of the venting line 76 is closed. The venting time per container 5 is between 0.1 and 0.4 seconds, preferably about 0.2 seconds. The chamber wall 18 is raised again when ambient pressure is reached inside the chamber interior 4. The coated container 5 is then taken out and/or transferred to the exit wheel 12.

The invention has been described hereinbefore by reference to embodiments. It goes without saying that numerous variations as well as modifications are possible without departing from the inventive concept underlying the invention.

LIST OF REFERENCE CHARACTERS

1 Plasma module
2 Plasma wheel
3 Plasma station
4 Chamber interior
5 Container
5.1 Container interior
6 Entry
7 Descrambling wheel
8 Transfer wheel
9 Support arm
10 Base
11 Entry wheel
12 Exit wheel
13 Exit section
14 Carrier ring
15 Machine base
16 Station frame
17 Plasma chamber
18 Chamber wall
19 Microwave generator
20 Rotary distributor
21 Ring main
23 Guide rod
24 Carriage
25 Deflector
26 Adapter
27 Coupling channel
28 Holding element
29 Chamber floor
30 Chamber base
31 Chamber base
32 Flange
33 Seal
34 Inner flange
35 Seal
36 Gas lance
37 Lance carriage
38 Process gas channel
39 Gas connection
40 Treatment place
70 Vacuum channel
70.1 First side
70.2 Second side
71 First vacuum line
71.1 Valve mechanism
72 Second vacuum line
72.1 Valve mechanism
73 Third vacuum line
73.1 Valve mechanism
74 Fourth vacuum line
74.1 Valve mechanism
75 Fifth vacuum line
75.1 Valve mechanism
76 Venting line
76.1 Valve mechanism
77 Vacuum device
78 Pressure measuring device
78.1 Valve mechanism
80 Central process gas line
80.1 Valve mechanism
81 First process gas line
81.1 Valve mechanism
82 Second process gas line
82.2 Valve mechanism
83 Third process gas line 83.1 Valve mechanism
84 Bypass line
84.1 First side
84.2 Second side
84.3 Valve mechanism
84.4 Throttle device
85 Sixth vacuum line
85.1 First side
85.2 Second side
85.3 Valve mechanism
86 Pressure measuring device

We claim:

1. A method for plasma treatment of a plurality of containers using a plasma module comprising a plurality of plasma stations which are arranged on a plasma wheel, each plasma station comprising a plasma chamber having a treatment place, the method comprising:
inserting and positioning one of the plurality of containers having a container interior on the treatment place inside of a corresponding one of the plurality of plasma stations, wherein the one of the plurality of containers being inserted and positioned on the treatment place in the plasma chamber receives the plasma treatment
evacuating at least a portion of gases from the container receiving the plasma treatment and the corresponding plasma chamber;
applying a predetermined quantity of a process gas to the container interior inside the at least partially evacuated plasma chamber, wherein the applying of the process gas is effected at the plasma station by a central process gas supply;
providing the container interior with an internal coating by the plasma treatment;
providing, after the plasma treatment, a venting operation in which both the plasma chamber and the container interior of the container are at least partially vented;
wherein during at least one of an operational malfunction and a cut-out in the treatment place of one of the plurality of plasma stations, before the process gas is supplied to at least one of the treatment place and to the container retained thereon the treatment place, the process gas is at least partially diverted away from the treatment place by a bypass line such that no increase in throughput of the process gas is delivered to another of the plurality of plasma stations as a result of partially diverting a portion of the process gas through the bypass line.

2. The method of claim 1, wherein for the treatment place which has at least one of an operational malfunction and cut-out, a quantity of process gas that is diverted corresponds with a predetermined quantity of process gas for this treatment place when operating intact.

3. The method of claim 1, wherein during the at least one of an operational malfunction and cut-out, for at least one entire plasma station the process gas is diverted before it is supplied to the plasma station.

4. The method of claim 1, wherein the process gas is diverted in the bypass line by at least one of a by-pass valve mechanism and a by-pass throttle device in a regulated and/or controlled manner.

5. The method of claim 4, wherein a volumetric flow-rate of the process gas that is diverted can be regulated and/or controlled in the bypass line by the by-pass throttle device.

6. The method of claim 4, wherein the by-pass throttle device of the bypass line of the treatment place which has an operational malfunction and/or which has been cut out, is controlled and/or regulated in such a way that the volumetric flow-rate of process gas diverted by bypass line corresponds to the volumetric flow-rate of process gas which is applied by one or a plurality of other process gas valve mechanisms to the treatment place which has an operational malfunction and/or which has been cut out.

7. The method of claim 6, wherein simultaneously with or before opening of one or a plurality of process gas valve mechanisms of the at least one plasma chamber which has an operational malfunction and/or which has been cut out, the by-pass valve mechanism is opened and the process gas is diverted by the bypass line.

8. The method of claim 6, wherein the process gas is diverted in a predetermined quantity of process gas and/or in a timed sequence to the treatment place which has an operational malfunction by one or a plurality of process gas lines of a central process gas supply.

9. The method of claim 1, wherein the process gas of the treatment place which has an operational malfunction is diverted by the bypass line into a central vacuum device.

10. The method of claim 9, wherein the process gas of the treatment place which has an operational malfunction and/or which has been cut out, is diverted by the bypass line in a vacuum line with the vacuum level of the central vacuum device.

11. The method of claim 1, wherein each plasma chamber includes a plurality of treatment places and the containers therein contemporaneously undergo the plasma treatment.

12. The method of claim 1, wherein each plasma station includes a plurality of treatment places and the containers therein contemporaneously undergo the plasma treatment.

13. The method of claim 1, wherein each plasma station includes a plurality of plasma chambers and the containers therein contemporaneously undergo the plasma treatment.

14. The method of claim 1, wherein the applying of the process gas is simultaneously effected at least two of the plurality of plasma stations (3) having containers by the central process gas supply.

* * * * *